(12) United States Patent
Kim

(10) Patent No.: US 10,580,840 B2
(45) Date of Patent: Mar. 3, 2020

(54) ORGANIC LIGHT-EMITTING DISPLAY DEVICE HAVING AN ORGANIC EMITTING LAYER

(71) Applicant: LG Display Co., Ltd., Seoul (KR)

(72) Inventor: Eun-Jin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 2 days.

(21) Appl. No.: 15/826,190

(22) Filed: Nov. 29, 2017

(65) Prior Publication Data

US 2018/0151648 A1    May 31, 2018

(30) Foreign Application Priority Data

Nov. 30, 2016   (KR) .................. 10-2016-0162270

(51) Int. Cl.
*H01L 27/32* (2006.01)
*H01L 51/52* (2006.01)

(52) U.S. Cl.
CPC ...... *H01L 27/3246* (2013.01); *H01L 27/3258* (2013.01); *H01L 51/5209* (2013.01); *H01L 51/5225* (2013.01); *H01L 51/5253* (2013.01)

(58) Field of Classification Search
CPC ............. H01L 27/3246; H01L 27/3258; H01L 51/5209; H01L 51/5225; H01L 51/5253
USPC ....................... 257/40; 438/82, 99
See application file for complete search history.

(56) References Cited

U.S. PATENT DOCUMENTS

| | | | | |
|---|---|---|---|---|
| 2004/0072380 | A1* | 4/2004 | Yamazaki | H01L 27/3246 438/30 |
| 2009/0309489 | A1* | 12/2009 | Takata | H01L 27/3246 313/504 |
| 2013/0256638 | A1* | 10/2013 | Uesugi | H01L 51/5228 257/40 |
| 2015/0349293 | A1* | 12/2015 | Park | H01L 51/5253 257/40 |

* cited by examiner

*Primary Examiner* — Didarul A Mazumder
(74) *Attorney, Agent, or Firm* — Polsinelli PC

(57) ABSTRACT

An organic light-emitting display device is provided. The organic light-emitting display device includes at least one insulating layer disposed between a lower substrate and a light-emitting structure. The insulating layer includes a side surface is disposed outside a display area for displaying images by the light-emitting structure. The side surface of the insulating layer is negatively tapered.

20 Claims, 3 Drawing Sheets

ORGANIC LIGHT-EMITTING DISPLAY DEVICE HAVING AN ORGANIC EMITTING LAYER

CROSS-REFERENCE TO RELATED APPLICATION

This application claims the benefit of Korean Patent Application No. 10-2016-0162270, filed on Nov. 30, 2016, which is hereby incorporated by reference in its entirety as if fully set forth herein.

BACKGROUND

Field of the Disclosure

The present disclosure relates to a display device, and more particularly, to an organic light-emitting display device which realizes images using an organic emitting layer.

Description of the Background

In general, electronic apparatuses such as monitors, TVs, notebook computers and digital cameras include display devices for displaying images. For example, display devices can include a liquid crystal display (LCD) and/or an organic light-emitting display device.

The organic light-emitting display device realizes images using a light-emitting structure. For example, the light-emitting structure includes a lower electrode, an upper electrode and an organic emitting layer interposed between the lower electrode and the upper electrode.

The organic emitting layer tends to be highly vulnerable to moisture. A method of manufacturing the organic light-emitting display device typically includes an encapsulation process in order to prevent external moisture from permeating into the organic emitting layer. For example, the method of manufacturing the organic light-emitting display device comprises a process of forming an upper passivation layer including an inorganic layer and/or an organic layer stacked on the light-emitting structure, and a process of attaching an upper substrate to a lower substrate using an adhesive film including a moisture-absorbent.

The organic emitting layer is formed by a deposition process using a mask. A deposition shadow can occur by the deposition process due to deformation of a deposition target and/or the mask. For example, the organic emitting layer can include a tail region formed on a non-display area disposed outside a display area of the lower substrate due to the deposition shadow.

However, the tail region of the organic emitting layer is disposed close to the edge of the lower substrate and thus external moisture can easily permeate thereinto. Since the tail region of the organic emitting layer is connected to the organic emitting layer formed on the display area of the lower substrate, moisture permeating through the tail region reduces the lifespan of the light-emitting structure. Furthermore, when the area of the non-display area of the lower substrate can be increased in order to prevent moisture permeation through the tail region of the organic emitting layer. Inevitably, there is a problem that the area of the display area of the lower substrate is relatively reduced.

SUMMARY OF THE DISCLOSURE

Accordingly, the present disclosure is to provide an organic light-emitting display device capable of preventing moisture permeation through the tail region of the organic emitting layer.

In addition, the present disclosure is to provide an organic light-emitting display device capable of blocking a moisture permeation path due to a deposition shadow without increasing the area of the non-display area.

The technical problems solved by the present disclosure are not limited to the above technical problems and those skilled in the art may understand other technical problems from the following description.

To accomplish additional features and advantages of the present disclosure, an organic light-emitting display device according to the aspect of the present disclosure includes: a lower substrate including a display area and a non-display area disposed outside the display area; a light-emitting structure on the display area of the lower substrate and including a lower electrode, an organic emitting layer and an upper electrode, which are sequentially stacked; and a first insulating layer between the lower substrate and the light-emitting structure and extended onto the non-display area of the lower substrate. The first insulating layer overlaps with the non-display area of the lower substrate and includes a first insulating side surface which is negatively tapered.

The upper surface of the first insulating layer facing the light-emitting structure may be parallel with the surface of the lower substrate.

The organic emitting layer may be extended onto the non-display area of the lower substrate. The organic emitting layer may expose the first insulating side surface and a portion of the surface of the lower substrate overlapping with the first insulating side.

The upper electrode may be extended onto the non-display area of the lower substrate. The upper electrode may directly contact the first insulating side surface and the surface of the lower substrate exposed by the organic emitting layer.

The organic light-emitting display device may further include a second insulating layer covering the edge of the lower electrode and including a second insulating side surface overlapping with the non-display area of the lower substrate. The second insulating side surface of the second insulating layer may be disposed on the first insulating layer.

The second insulating side surface of the second insulating layer may be negatively tapered.

The organic light-emitting display device may further include an upper passivation layer on the light-emitting structure. The upper passivation layer may include a region separated from the other region thereof by the first insulating side surface of the first insulating layer.

The organic light-emitting display device may further include: an upper substrate on the light-emitting structure and extended onto the non-display area of the lower substrate; and an adhesive layer between the lower substrate and the upper substrate and covering the light-emitting structure. A side surface of the adhesive layer may be disposed between a side surface of the lower substrate and the first insulating side surface of the first insulating layer.

To accomplish the other advantages, an organic light-emitting display device according to the aspect of the present disclosure includes: a lower electrode on a display area of a lower substrate; a bank insulating layer covering the edge of the lower electrode; an organic emitting layer on the lower electrode and extended onto the bank insulating layer; and an upper electrode on the organic emitting layer. The bank insulating layer is disposed outside the display area of the lower substrate and the bank insulating layer includes a bank side surface which is negatively tapered.

In a further aspect of the present disclosure, an organic light-emitting display device including first and second substrates include a light emitting structure including a light emitting layer and first and second electrodes over the second substrate, wherein the light emitting layer has first and second regions spaced apart from each other and the second region is located outside a display area; a first insulating layer disposed between the light emitting structure and the second substrate, wherein the first insulating layer has a first insulating layer side surface outside the display area and the first side surface has an angle greater or smaller than a vertical angle with respect to the second substrate; and a second insulating layer contacting the first insulating layer and having a second insulating layer side surface outside the display area, wherein the second side surface has an angle greater or smaller than a vertical angle with respect to the second substrate.

The upper electrode may directly contact the bank side surface of the bank insulating layer.

The organic light-emitting display device may further include an over-coat layer between the lower substrate and the lower electrode. The bank insulating layer may cover a coat side surface of the over-coat layer.

The coat side surface of the over-coat layer may be positively tapered.

In the organic light-emitting display devices according to the technical spirit of the present disclosure, a tail of the organic emitting layer due to a deposition shadow can be separated from the organic emitting layer positioned in the display area of the lower substrate by at least one insulating layer positioned between the lower substrate and the organic emitting layer. Accordingly, it is possible to prevent moisture permeation through the tail of the organic emitting layer without increasing the area of the non-display area in the organic light-emitting display devices according to the technical spirit of the present disclosure. Therefore, the lifespan and reliability of the light-emitting structure can be improved and production efficiency can be enhanced in the organic light-emitting display devices according to the technical spirit of the present disclosure.

BRIEF DESCRIPTION OF THE DRAWINGS

The accompanying drawings, which are included to provide a further understanding of the present disclosure and are incorporated in and constitute a part of this application, illustrate aspects of the disclosure and together with the description serve to explain of the principle of the disclosure.

In the drawings.

DETAILED DESCRIPTION OF THE DISCLOSURE

Figure 1:
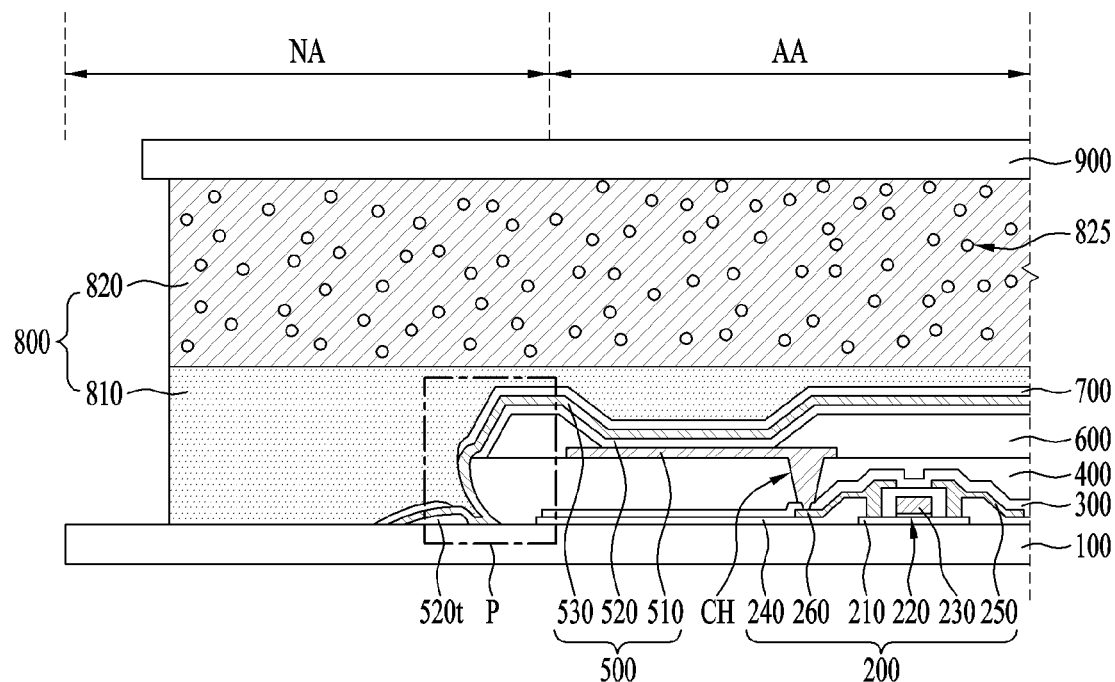
FIG. 1 a cross-sectional view schematically showing an organic light-emitting display device according to an aspect of the present disclosure.

Hereinafter, details related to the above objects, technical configurations, and operational effects of the present disclosure will be clearly understood by the following detailed description with reference to the drawings, which illustrate aspects of the present disclosure. Here, the aspects of the present disclosure are provided in order to allow the technical sprit of the present disclosure to be sufficiently conveyed to those skilled in the art, and thus the present disclosure may be embodied in other forms and is not limited to the aspects described below.

In addition, the same or extremely similar elements are designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element from another element. However, the first element and the second element may be arbitrarily named according to the convenience of those skilled in the art without departing the technical sprit of the present disclosure.

The terms used in the specification of the present disclosure are merely used in order to describe particular aspects, and are not intended to limit the scope of the present disclosure. For example, an element described in the singular form is intended to include a plurality of elements unless context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example aspects pertains. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

EXAMPLE

Figure 2:
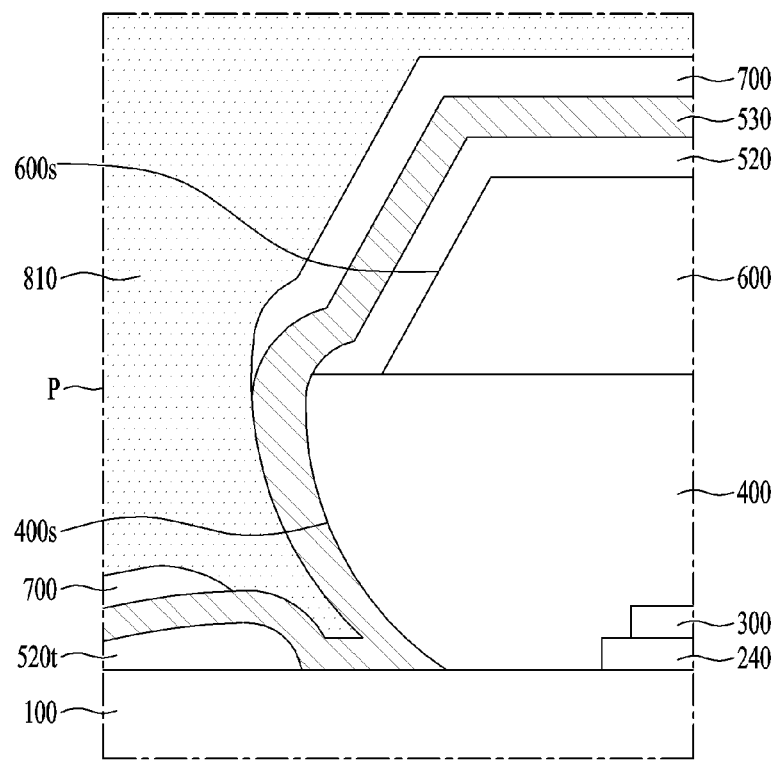
FIG. 2 is an enlarged view of the area P of FIG. 1.

FIG. 1 is a cross-sectional view schematically showing an organic light-emitting display device according to an aspect of the present disclosure. FIG. 2 is an enlarged view of the area P of FIG. 1.

Referring to FIGS. 1 and 2, the organic light-emitting display device according to an aspect of the present disclosure may include a lower substrate 100, a thin film transistor 200, an over-coat layer 400, a light-emitting structure 500, an adhesive layer 800 and an upper substrate 900.

The lower substrate 100 may support the thin film transistor 200 and the light-emitting structure 500. The lower substrate 100 may include an insulating material as well as a transparent material. For example, the lower substrate 100 can include glass or plastic.

The lower substrate 100 may include a display area AA and a non-display area NA. The non-display area NA may be disposed outside the display area AA. For example, the non-display area NA of the lower substrate 100 may be a region including the edge of the lower substrate 100.

The thin film transistor 200 may be disposed on the lower substrate 100. For example, the thin film transistor 200 may overlap a portion of the display area AA of the lower substrate 100. The thin film transistor 200 may include a semiconductor pattern 210, a gate insulating layer 220, a gate electrode 230, an interlayer insulating layer 240, a source electrode 250 and a drain electrode 260.

The semiconductor pattern 210 may be disposed close to the lower substrate 100. The semiconductor pattern 210 may include a semiconductor material. For example, the semiconductor pattern 210 may include amorphous silicon or polysilicon. For another example, the semiconductor pattern 210 may include an oxide semiconductor material such as IGZO.

The semiconductor pattern 210 may include a source region, a drain region and a channel region. The channel region may be positioned between the source region and the drain region. Conductivity of the channel region may lower than conductivities of the source region and the drain region. For example, the source region and the drain region may contain conductive impurities.

The organic light-emitting display device according to the aspect of the present disclosure is described that the semiconductor pattern 210 is in direct contact with the lower substrate 100. However, an organic light-emitting display device according to another aspect of the present disclosure may further include a buffer insulating layer disposed between the lower substrate 100 and the thin film transistor 200. The buffer insulating layer may be extended beyond the display area AA of the lower substrate 100. For example, the buffer insulating layer may include a side surface overlapping a portion of the non-display area NA of the lower substrate 100. The buffer insulating layer may include an insulating material. For example, the buffer insulating layer may include silicon oxide.

The gate insulating layer 220 may be disposed on the semiconductor pattern 210. For example, the gate insulating layer 220 may overlap the channel region of the semiconductor pattern 210. The gate insulating layer 220 may include an insulating material. For another example, the gate insulating layer 220 may include silicon oxide and/or silicon nitride. The gate insulating layer 220 may contain a high-K dielectric material. For example, the gate insulating layer 220 may contain hafnium oxide (HfO) or titanium oxide (TiO). The gate insulating layer 220 may have a multi-layer structure.

The gate electrode 230 may be disposed on the gate insulating layer 220. The gate electrode 230 may overlap the channel region of the semiconductor pattern 210. For example, the gate insulating layer 220 may include a side surface vertically aligned with a side surface of the gate electrode 230. The side of the gate insulating layer 220 may be continuous with the side of the gate electrode 230. The gate electrode 230 may include a conductive material. For example, the gate electrode 230 may include a metal such as aluminum (Al), chrome (Cr), molybdenum (Mo) and tungsten (W).

The interlayer insulating layer 240 may be disposed on the semiconductor pattern 210 and the gate electrode 230. The interlayer insulating layer 240 may be extended beyond the semiconductor pattern 210. For example, the interlayer insulating layer 240 may include a side surface disposed on the non-display area NA. The interlayer insulating layer 240 may include an insulating material. For another example, the interlayer insulating layer 240 may include silicon oxide and/or silicon nitride. The interlayer insulating layer 240 may have a multi-layer structure.

The source electrode 250 and the drain electrode 260 may be disposed on the interlayer insulating layer 240. The drain electrode 260 may be spaced from the source electrode 250. The source electrode 250 may be electrically connected to the source region of the semiconductor pattern 210. The drain electrode 260 may be electrically connected to the drain region of the semiconductor pattern 210. For example, the interlayer insulating layer 240 may include a source contact hole exposing the source region of the semiconductor pattern 210 and a drain contact hole exposing the drain region of the semiconductor pattern 210.

Each of the source electrode 250 and the drain electrode 260 may include a conductive material. For example, each of the source electrode 250 and the drain electrode 260 may include a metal such as aluminum (Al), chrome (Cr), molybdenum (Mo) and tungsten (W). The drain electrode 260 may include the same material as the source electrode 250. In addition, the drain electrode 260 and the source electrode 250 may be simultaneously formed. The gate electrode 230 may include a material different from the source electrode 250 and the drain electrode 260.

The organic light-emitting display device according to the aspect of the present disclosure is described that the thin film transistor 200 includes the semiconductor pattern 210 which is positioned in proximity to the lower substrate 100. However, in the organic light-emitting display device according to another aspect of the present disclosure, the thin film transistor 200 may include the semiconductor pattern 210 which is positioned between the gate electrode 230 and the source and drain electrodes 250 and 260.

The over-coat layer 400 may be disposed on the thin film transistor 200. The over-coat layer 400 may remove a step coverage caused by the thin-film transistor 300. For example, the upper surface of the over-coat layer 400 may be parallel with the surface of the lower substrate 100.

The over-coat layer 400 may be extended beyond the display area AA of the lower substrate 100. For example, the over-coat layer 400 may include a coat side surface 400s overlapping the non-display area NA of the lower substrate 100. The thin film transistor 200 may be completely covered by the over-coat layer 400. The coat side surface 400a of the over-coat layer 400 may have a reverse taper structure.

The over-coat layer 400 may include an insulating material. For example, the over-coat layer 400 may include an organic insulating material.

The organic light-emitting display device according to the aspect of the present disclosure may further include a lower passivation layer 300 disposed between the thin film transistor 200 and the over-coat layer 400. The lower passivation layer 300 may include an insulating material. The lower passivation layer 300 may include a material different from the over-coat layer 400. For example, the lower passivation layer 300 may include silicon oxide and/or silicon nitride. The lower passivation layer 300 may have a multi-layer structure.

The light-emitting structure 500 may generate light realizing a specific color. For example, the light-emitting structure 500 may include a lower electrode 510, an organic emitting layer 520 and an upper electrode 530, which are sequentially stacked.

The light-emitting structure 500 may be controlled by the thin film transistor 200. For example, the lower electrode 510 of the light-emitting structure 500 may be electrically connected to the drain electrode 260 of the thin film transistor 200. The light-emitting structure 500 may be disposed on the over-coat layer 400. For example, the over-coat layer 400 may include an electrode contact hole CH exposing the drain electrode 260 of the thin film transistor 200. The lower passivation layer 300 may include a lower contact hole overlapping with a portion of the electrode contact hole CH.

The lower electrode 510 may include a conductive material. The lower electrode 510 may include a transparent material. For example, the lower electrode 510 may be a transparent electrode including a transparent conductive material such as ITO and IZO.

In the organic light-emitting display device according to the aspect of the present disclosure, the light-emitting structures 500 of neighboring pixel regions may be independently driven. For example, the organic light-emitting display device according to the aspect of the present disclosure may further include a bank insulating layer 600 in order to insulate the lower electrodes 510 of the neighboring light-emitting structures 500 from each other. The bank insulating layer 600 may cover the edge of the lower electrode 510 of each light-emitting structure 500. The organic emitting layer 520 and the upper electrode 530 may be stacked on a portion of the lower electrode 510 exposed by the bank insulating layer 600.

The bank insulating layer 600 may be extended onto the non-display area NA of the lower substrate 100. For example, the bank insulating layer 600 may include a bank side surface 600s disposed outside the display area AA of the lower substrate 100. The bank side surface 600s of the bank insulating layer 600 may be disposed on the over-coat layer 400. For example, the upper surface of the outermost portion of the over-coat layer 400 may be exposed by the bank insulating layer 600.

The bank insulating layer 600 may include an insulating material. For example, the bank insulating layer 600 may include an organic insulating material such as benzocyclobutene (BCB), polyimide and photoacryl. The bank insulating layer 600 may include a material different from the over-coat layer 400.

The organic emitting layer 520 may generate light having luminance corresponding to a voltage difference between the lower electrode 510 and the upper electrode 530. For example, the organic emitting layer 520 may include an emitting material layer (EML) including a light-emitting material. In addition, the light-emitting material may be an organic material.

The organic emitting layer 520 may have a multi-layer structure in order to improve emission efficiency. For example, the organic emitting layer 520 may include at least one of a hole injection layer (HIL), a hole transport layer (HTL), an electron transport layer (ETL) and an electron injection layer (EIL).

The organic emitting layer 520 may be formed by a deposition process using a mask. The organic emitting layer 520 may be extended onto the non-display area NA of the lower substrate 100. For example, the organic emitting layer 520 may include a tail region 520t disposed on the non-display area NA of the lower substrate 100.

The organic emitting layer 520 may not be formed on the coat side surface 400s of the over-coat layer 400 which has a reverse taper structure, and a portion of the surface of the lower substrate 100 which is covered by the coat side surface 400s by characteristics of the deposition process. For example, the coat side surface 400s of the over-coat layer 400 and the portion of the surface of the lower substrate 100 which overlaps with the coat side surface 400s may be exposed by the organic emitting layer 520. The tail region 520t of the organic emitting layer 520 may be separated from the portion of the organic emitting layer 520, which is positioned on the display area AA of the lower substrate 100, by the coat side surface 400s of the over-coat layer 400. Thus, the organic light-emitting display device according to the aspect of the present disclosure can prevent moisture permeating through the tail region 520t of the organic emitting layer 520 from moving to the organic emitting layer 520 positioned on the display area AA of the lower substrate 100. Therefore, in the organic light-emitting display device according to the aspect of the present disclosure, the area of the non-display area NA of the lower substrate 100 can be minimized and deterioration of the light-emitting structure 500 due to moisture permeation can be prevented.

The upper electrode 530 may include a conductive material. The upper electrode 530 may include a material different from the lower electrode 510. For example, the upper electrode 530 may include a material having high reflectivity. For another example, the upper electrode 530 may include aluminum (Al).

The upper electrode 530 may be extended along the organic emitting layer 520. For example, the upper electrode 530 may be extended onto the non-display area NA of the lower substrate 100.

The upper electrode 530 may have a higher step coverage than the organic emitting layer 520. For example, the upper electrode 530 may be formed by a sputtering process. The upper electrode 530 having a relatively high step coverage may be extended onto the coat side surface 400s of the over-coat layer 400 and the surface of the lower substrate 100 overlapping with the coat side surface 400s on which the organic emitting layer 520 is not formed. For example, the upper electrode 530 may be in direct contact with the coat side surface 400s of the over-coat layer 400 and a portion of the surface of the lower substrate 100, which are exposed by the organic emitting layer 520. Thus, the organic light-emitting display device according to the aspect of the present disclosure can effectively prevent external moisture from permeating into the display area AA of the lower substrate 100. Therefore, in the organic light-emitting display device according to the aspect of the present disclosure, a path of permeating the moisture can be effectively blocked.

The organic light-emitting display device according to the aspect of the present disclosure may further include an upper passivation layer 700 disposed on the light-emitting structure 500. The upper passivation layer 700 may include an insulating material. For example, the upper passivation layer 700 may include an inorganic layer and/or an organic layer. The upper passivation layer 700 may be a multi-layer structure. For another example, the upper passivation layer 700 may have a structure in which at least one organic layer is interposed between the inorganic layers.

The upper passivation layer 700 may be extended along the upper electrode 530 of the light-emitting structure 500. For example, the upper passivation layer 700 may be extended onto the non-display area NA of the lower substrate 100. The upper passivation layer 700 may include a region separated from the other region thereof by the coat side surface 400s of the over-coat layer 400 which is negatively tapered. For example, the upper passivation layer 700 may be separated into a region positioned on the tail region 520t of the organic emitting layer 520 and a region positioned on the display area AA of the lower substrate 100 by the coat side surface 400s of the over-coat layer 400.

The adhesive layer 800 may be disposed on the light-emitting structure 500 and the upper passivation layer 700. The light-emitting structure 500 may be protected from external impact, particles, moisture, and oxidation by the upper passivation layer 700 and the adhesive layer 800.

The adhesive layer 800 may be extended onto the non-display area NA of the lower substrate 100. The adhesive layer 800 may completely cover the over-coat layer 400. For example, a side surface of the adhesive layer 800 may be disposed between a side surface of the lower substrate 100 and the coat side surface 400s of the over-coat layer 400.

Thus, in the organic light-emitting display device according to the aspect of the present disclosure, moisture permeation into the display area AA of the lower substrate 100 can be efficiently prevented.

The adhesive layer 800 may have a multi-layer structure. For example, the adhesive layer 800 may include a lower adhesive layer 810 and an upper adhesive layer 820.

The lower adhesive layer 810 may be disposed close to the lower substrate 100. The lower adhesive layer 810 may be in direct contact with the upper passivation layer 700. The lower adhesive layer 810 may directly contact the upper electrode 530 of the light-emitting structure 500 between the separated regions of the upper passivation layer 700.

The lower adhesive layer 810 may include a curable material. For example, the lower adhesive layer 810 may include a resin such as epoxy, phenol, amino, unsaturated polyester or olefin. For another example, the lower adhesive layer 810 may include a thermosetting resin.

The upper adhesive layer 820 may be disposed on the lower adhesive layer 810. The side surface of the lower adhesive layer 810 may be vertically aligned with the side surface of the upper adhesive layer 820. For example, the side surface of the upper adhesive layer 820 may be continuous with the side surface of the lower adhesive layer 810.

The upper adhesive layer 820 may include a curable material. For example, the upper adhesive layer 810 may include a thermosetting resin. The upper adhesive layer 820 may include a material different from the lower adhesive layer 810.

The upper adhesive layer 820 may further include a moisture-absorbing material 825. The moisture-absorbing material 825 can capture moisture permeating from the outside. The lower adhesive layer 810 can alleviate the stress due to expansion of the moisture-absorbing material 825 in the upper adhesive layer 820. Thus, in the organic light-emitting display device according to the aspect of the present disclosure, moisture permeation and damage to the light-emitting structure 500 due to external impact can be securely prevented.

The upper substrate 900 may be disposed on the adhesive layer 800. The upper substrate 900 may overlap the display area AA and the non-display area NA of the lower substrate 100. The upper substrate 900 may be attached to the lower substrate 100 by the adhesive layer 800. The adhesive layer 800 may be disposed between the lower substrate 100 and the upper substrate 900. The adhesive layer may cover the light-emitting structure 500.

The area of the upper substrate 900 may be greater than the area of the adhesive layer 800. For example, the side surface of the upper substrate 900 can be positioned between the side surface of the lower substrate 100 and the side surface of the adhesive layer 800. The adhesive layer 800 can expose the outermost region of the lower substrate 100 and the outermost region of the upper substrate 900. Thus, in the organic light-emitting display device according to the aspect of the present disclosure, it is possible to prevent the adhesive layer 800 from flowing to the side surfaces of the lower substrate 100 and/or the upper substrate 900 due to the process margin.

The upper substrate 900 may include a material having a predetermined level of hardness or higher. The upper substrate 900 may include a material that can effectively transfer the heat generated from the thin film transistor 200 and the light-emitting structure 500. For example, the upper substrate 900 can contain a metal such as aluminum and copper.

The organic light-emitting display device according to the aspect of the present disclosure is described that it is a bottom emission type in which the upper electrode 530 and the upper substrate 900 are formed of an opaque material. However, an organic light-emitting display device according to another aspect of the present disclosure may be a top emission type or a dual emission type including the transparent upper electrode 530 and the transparent upper substrate 900.

Figure 3:
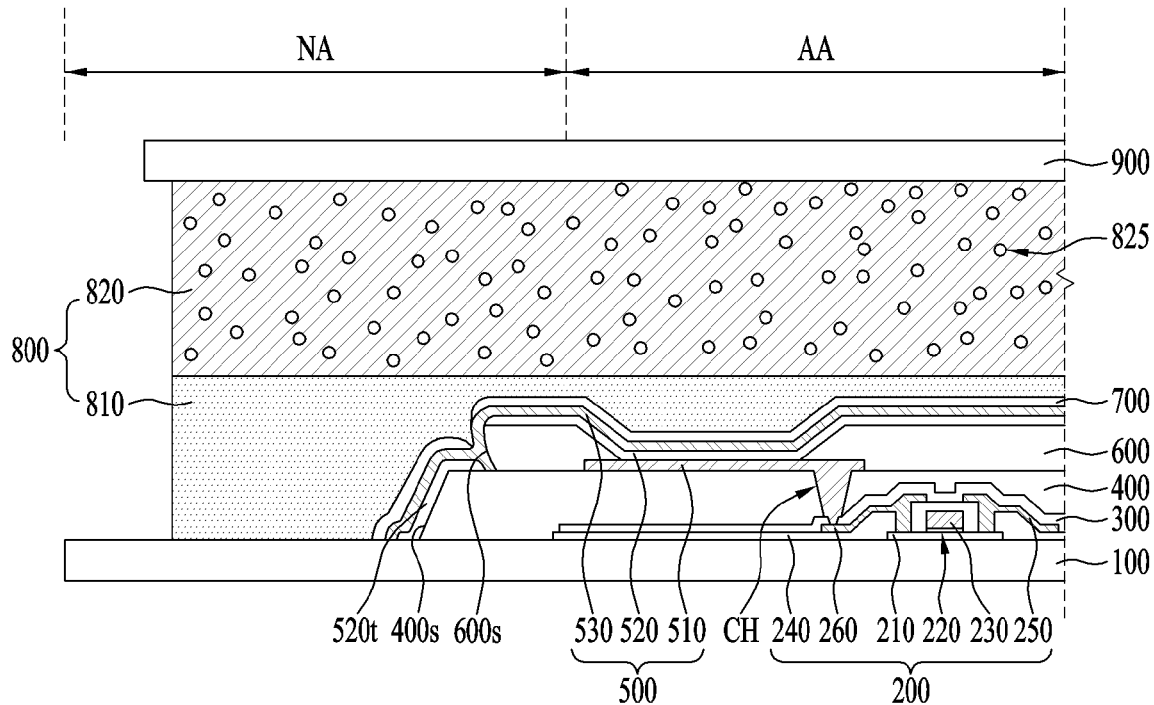
FIGS. 3 to 5 are cross-sectional views showing organic light-emitting display devices according to other aspects of the present disclosure.

The organic light-emitting display device according to the aspect of the present disclosure is described that the coat side surface 400s of the over-coat layer 400 has a reverse taper structure in order to block moisture permeation through the tail region 520t of the organic emitting layer 520. However, in an organic light-emitting display device according to another aspect of the present disclosure, a side surface of another insulating layer disposed between the lower substrate 100 and the organic emitting layer 520 may be negatively tapered such that the organic emitting layer 520 positioned on the display area AA of the lower substrate 100 can be separated from the tail region 520t of the organic emitting layer 520 positioned on the non-display area NA of the lower substrate 100. For example, in the organic light-emitting display device according to another aspect of the present disclosure, the coat side surface 400s of the over-coat 400 may have a tapered structure while the bank side surface 600s of the bank insulating layer 600 may have a reverse taper structure, as shown in FIG. 3. Thus, in the organic light-emitting display device according to another aspect of the present disclosure, the organic emitting layer 520 extended onto the non-display area NA of the lower substrate 100 due to a deposition shadow can be cut on the over-coat layer 400.

Figure 4:
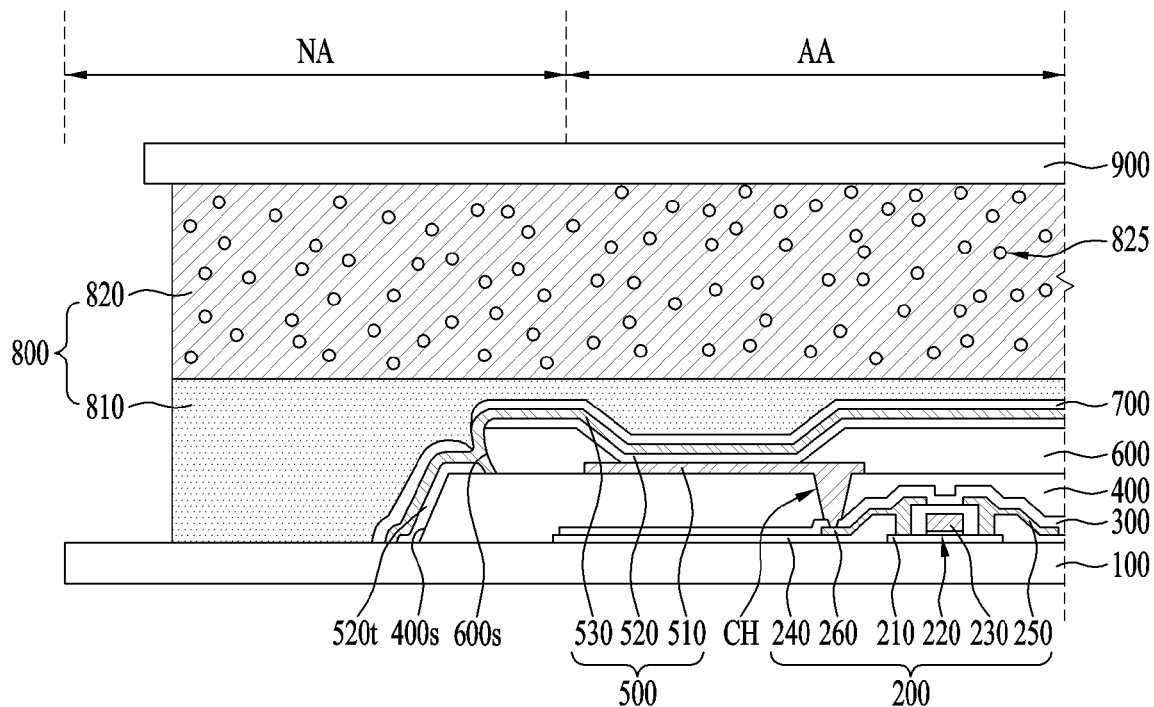

The organic light-emitting display device according to another aspect of the present disclosure is described that the bank side surface 600s of the bank insulating layer 600 is disposed on an upper surface of the over-coat layer 400 facing the light-emitting structure 500. However, in an organic light-emitting display device according to another aspect of the present disclosure, the bank insulating layer 600 may cover the coat side surface 400s of the over-coat layer 400, as shown in FIG. 4. Therefore, in the organic light-emitting display device according to another aspect of the present disclosure, the area of the surface of the lower substrate 100 which overlaps the bank side surface 600s of the bank insulating layer 600 which is reversely tapered increases, and thus the tail region 520t of the organic emitting layer 520 can be effectively separated.

Figure 5:
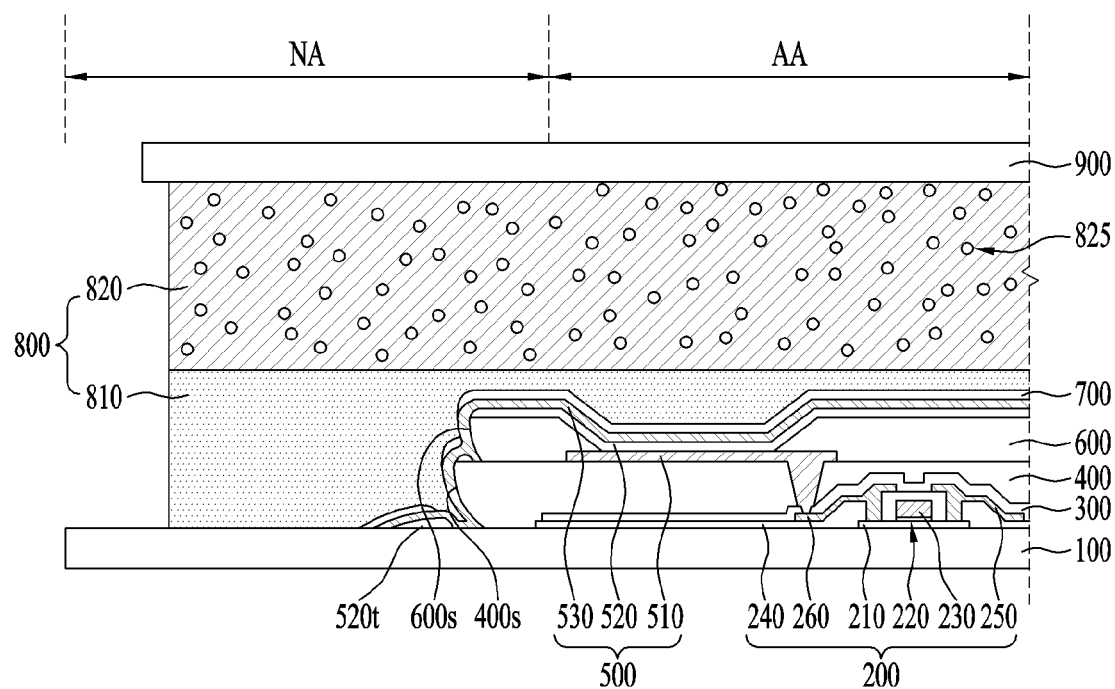

In the organic light-emitting display devices according to aspects of the present disclosure, the over-coat layer 400 or the bank insulating layer 600 positioned between the lower substrate 100 and the organic emitting layer 520 have a reversely tapered side surface. However, in an organic light-emitting display device according to another aspect of the present disclosure, two or more insulating layers disposed between the lower substrate 100 and the organic emitting layer 520 may have reversely tapered side surfaces. For example, in an organic light-emitting display device according to another aspect of the present disclosure, both the coat side surface 400s of the over-coat layer 400 and the bank side surface 600s of the bank insulating layer 600, positioned on the non-display area NB of the lower substrate 100, may be negatively tapered, as shown in FIG. 5. Thus, in the organic light-emitting display device according to another aspect of the present disclosure, the organic emitting layer 520 extended to the non-display area NA of the lower substrate 100 due to a deposition shadow can efficiently block a moisture permeation path.

Accordingly, the organic light-emitting display devices according to aspects of the present disclosure can block moisture permeation through the tail region 520t of the organic emitting layer 520 formed due to a deposition shadow using at least one insulating layer positioned between the lower substrate 100 and the organic emitting layer 520, thereby preventing decrease in the lifespan of the light-emitting structure due to external moisture without increasing the area of the non-display area NA of the lower substrate 100.

What is claimed is:

1. An organic light-emitting display device comprising:
   a lower substrate including a display area and a non-display area disposed outside the display area;
   a light-emitting structure at the display area of the lower substrate, the light-emitting structure including a lower electrode, an organic light emitting layer and an upper electrode; and
   a first insulating layer between the lower substrate and the light-emitting structure, the first insulating layer extended to the non-display area of the lower substrate,
   wherein the first insulating layer includes a first insulating side surface having a reverse taper structure, the first insulating side surface overlapping with the non-display area of the lower substrate, so that an under-cut is disposed between the non-display area of the lower substrate and the first insulating layer.

2. The organic light-emitting display device of claim 1, wherein the first insulating layer has an upper surface facing the light-emitting structure and the upper surface of the first insulating layer is parallel with an upper surface of the lower substrate.

3. The organic light-emitting display device of claim 1, wherein the organic emitting layer is extended to the non-display area of the lower substrate, and
   wherein the organic emitting layer exposes the first insulating side surface and a portion of the upper surface of the lower substrate overlapping with the first insulating side surface.

4. The organic light-emitting display device of claim 3, wherein the upper electrode is extended to the non-display area of the lower substrate, and
   wherein the upper electrode directly contacts the first insulating side surface and the upper surface of the lower substrate exposed by the organic light emitting layer.

5. The organic light-emitting display device of claim 1, further comprising a second insulating layer covering an edge of the lower electrode, the second insulating layer including a second insulating side surface overlapping the non-display area of the lower substrate,
   wherein the second insulating side surface of the second insulating layer is disposed on the first insulating layer.

6. The organic light-emitting display device of claim 5, wherein the second insulating side surface of the second insulating layer has a tapered structure.

7. The organic light-emitting display device of claim 1, further comprising an upper passivation layer on the light-emitting structure,
   wherein the upper passivation layer includes a first region separated from a second region thereof by the first insulating side surface of the first insulating layer.

8. The organic light-emitting display device of claim 1, further comprising:
   an upper substrate over the light-emitting structure, the upper substrate extended to the non-display area of the lower substrate; and
   an adhesive layer between the lower substrate and the upper substrate, the adhesive layer covering the light-emitting structure,
   wherein a side surface of the adhesive layer is disposed between a side surface of the lower substrate and the first insulating side surface of the first insulating layer.

9. An organic light-emitting display device comprising:
   a lower electrode on a display area of a lower substrate;
   a bank insulating layer covering an edge of the lower electrode;
   an organic light emitting layer on the lower electrode, the organic light emitting layer extended onto the bank insulating layer; and
   an upper electrode on the organic light emitting layer,
   wherein the bank insulating layer includes a bank side surface disposed outside the display area of the lower substrate, and
   wherein the bank side surface of the bank insulating layer is reversely tapered, so that an under-cut is disposed between the bank side surface and the lower substrate.

10. The organic light-emitting display device of claim 9, wherein the upper electrode directly contacts the bank side surface of the bank insulating layer.

11. The organic light-emitting display device of claim 9, further comprising an over-coat layer between the lower substrate and the lower electrode,
    wherein the bank insulating layer covers a coat side surface of the over-coat layer.

12. The organic light-emitting display device of claim 11, wherein the coat side surface of the over-coat layer has a tapered structure.

13. An organic light-emitting display device including first and second substrates, comprising:
    a light emitting structure including a light emitting layer between first and second electrodes over the second substrate, wherein the light emitting layer has first and second regions spaced apart from each other, and the second region is located outside a display area;
    a first insulating layer disposed between the light emitting structure and the second substrate, wherein the first insulating layer has a first insulating layer side surface outside the display area and the first insulating layer side surface has an angle greater or smaller than a vertical angle with respect to the second substrate, so that a first under-cut is disposed between the second substrate and the first insulating layer side surface of the first insulating layer; and
    a second insulating layer contacting the first insulating layer and having a second insulating layer side surface outside the display area, wherein the second insulating layer side surface has an angle greater or smaller than a vertical angle with respect to the second substrate so that a second under-cut is disposed between the first insulating layer and the second insulating layer side surface of the second insulating layer.

14. The organic light-emitting display device of claim 13, wherein the first electrode of the light emitting structure is disposed on the first region of the light emitting layer, the first insulating layer side surface of the first insulating layer and the second region of the light emitting layer.

15. The organic light-emitting display device of claim 13, wherein the first electrode of the light emitting structure has a portion contacting the second substrate between the first region and the second region of the light emitting layer.

16. The organic light-emitting display device of claim 13, further comprising a third insulation layer on the light-emitting structure.

17. The organic light-emitting display device of claim 16, wherein the third insulation layer includes first and second regions spaced apart from each other.

18. The organic light-emitting display device of claim 16, wherein the first region of the light emitting layer is disposed on the first electrode of the light emitting structure.

19. The organic light-emitting display device of claim 13, wherein the first substrate is disposed over the light-emitting structure and extended outside the display area.

20. The organic light-emitting display device of claim 19, further comprising:
   an adhesive layer between the first and second substrates, wherein the adhesive layer is disposed on the light-emitting structure and has a side surface disposed between a side surface of the second substrate and the first insulating layer side surface.

\* \* \* \* \*